(12) United States Patent
Mischitz et al.

(10) Patent No.: US 10,580,753 B2
(45) Date of Patent: Mar. 3, 2020

(54) METHOD FOR MANUFACTURING SEMICONDUCTOR DEVICES

(71) Applicant: Infineon Technologies AG, Neubiberg (DE)

(72) Inventors: Martin Mischitz, Wernberg (AT); Harald Huber, Glanegg (AT); Michael Knabl, Finkenstein (AT); Claudia Sgiarovello, Villach (AT); Caterina Travan, Villach (AT); Andrew Wood, St. Jakob im Rosental (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/656,388

(22) Filed: Jul. 21, 2017

(65) Prior Publication Data
US 2019/0027464 A1    Jan. 24, 2019

(51) Int. Cl.
*H01L 23/00*    (2006.01)
*H01L 23/525*   (2006.01)
*H01L 23/31*    (2006.01)
*H01L 25/065*   (2006.01)
*H01L 25/00*    (2006.01)

(52) U.S. Cl.
CPC .......... *H01L 24/94* (2013.01); *H01L 23/3171* (2013.01); *H01L 23/525* (2013.01); *H01L 25/0655* (2013.01); *H01L 25/50* (2013.01)

(58) Field of Classification Search
CPC . H01L 224/94; H01L 23/3171; H01L 23/562; H01L 21/3086; H01L 21/31; H01L 21/3205; H01L 23/5252; H01L 23/5256
See application file for complete search history.

(56) References Cited

U.S. PATENT DOCUMENTS

| | | | |
|---|---|---|---|
| 7,312,513 B1* | 12/2007 | Wilcox | H01L 23/5252 257/50 |
| 7,481,885 B2 | 1/2009 | Shimizu et al. | |
| 8,324,657 B2 | 12/2012 | Shimizu et al. | |
| 8,890,338 B2 | 11/2014 | Harris | |
| 2002/0111031 A1 | 8/2002 | Chase | |
| 2007/0202610 A1 | 8/2007 | Chiang | |
| 2009/0009196 A1 | 1/2009 | De Vries | |
| 2010/0284128 A1 | 11/2010 | Kabe | |
| 2012/0244644 A1 | 9/2012 | Wang | |
| 2013/0127042 A1* | 5/2013 | Lee | H01L 23/49838 257/737 |
| 2015/0115329 A1 | 4/2015 | Lin et al. | |
| 2016/0247685 A1* | 8/2016 | Chen | H01L 21/3086 |

FOREIGN PATENT DOCUMENTS

| | | |
|---|---|---|
| JP | 2007-059785 | 3/2007 |
| JP | 2008-085342 | 4/2008 |
| JP | 2016009840 | 1/2016 |

* cited by examiner

*Primary Examiner* — Wael M Fahmy
*Assistant Examiner* — Sarah K Salerno
(74) *Attorney, Agent, or Firm* — Dicke, Billig & Czaja, PLLC

(57) ABSTRACT

According to an embodiment of a method of manufacturing a plurality of semiconductor devices on a wafer, the method includes forming a structure layer comprising a plurality of same semiconductor device structures and providing a protective layer on the structure layer. The protective layer on a first one of the plurality of semiconductor device structures differs from the protective layer on a second one of the plurality of semiconductor device structures.

16 Claims, 12 Drawing Sheets

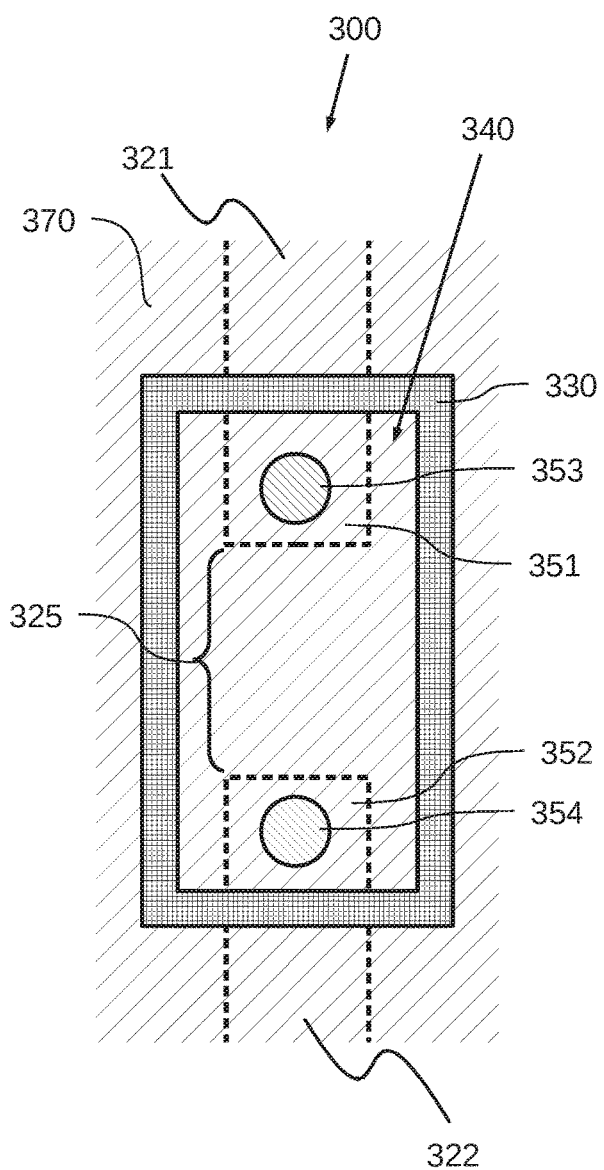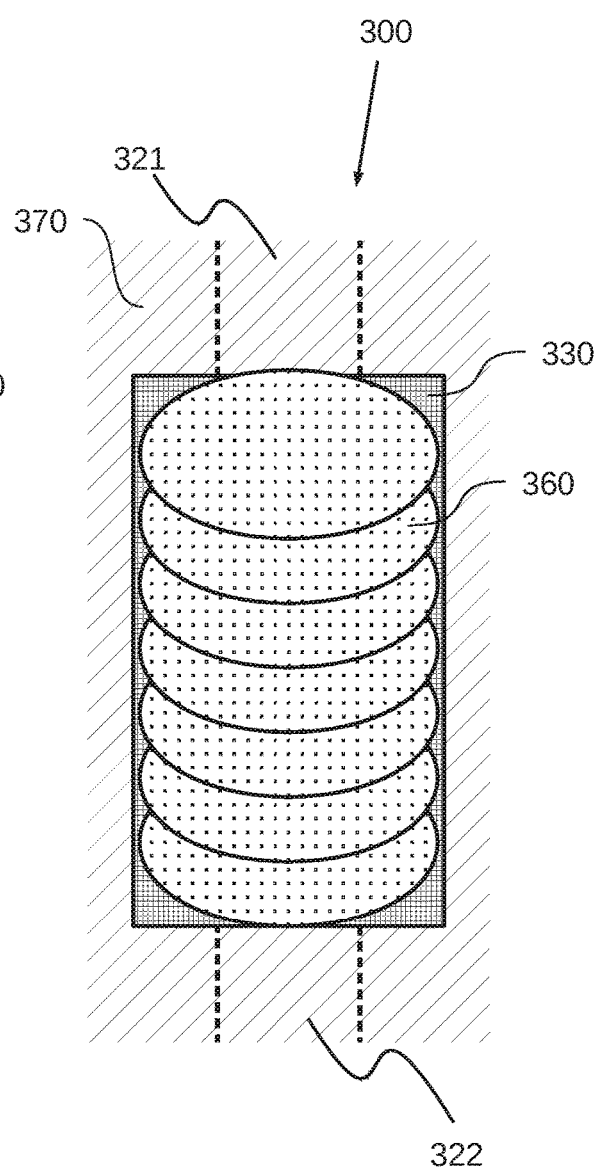

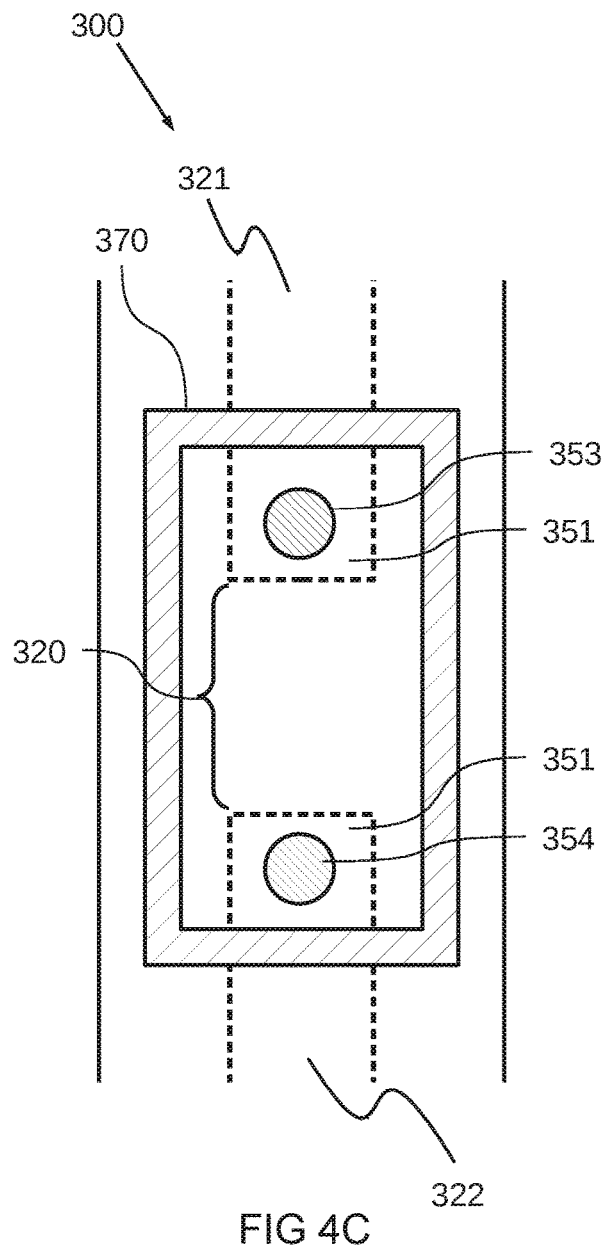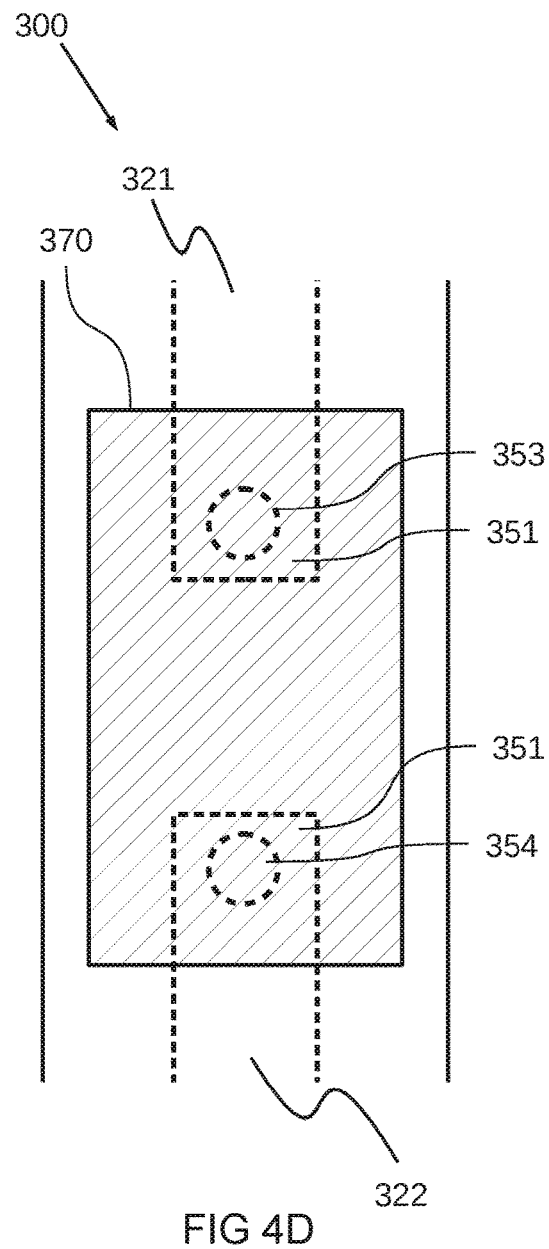

METHOD FOR MANUFACTURING SEMICONDUCTOR DEVICES

FIELD

The present disclosure relates to the manufacture of integrated circuit chips and, more particularly, to manufacture integrated circuit chips that are configurable.

BACKGROUND OF THE INVENTION

A conventional solution consists of measuring device deviations with respect to a target value once manufacturing of a wafer is complete, and by compensating deviations accordingly via extra processing. Depending on the device type, different solutions are currently in use. For example, fuse concepts can be used to fine-tune the electrical characteristics of a product after its final electrical testing at the wafer-level. For another example, current sensors are embedded in many ICs to insure constant monitoring and protection of the device during circuit start-up or malfunction.

Laser fuses can be used to configure wafers or devices on the wafer. Use of laser fuses however requires laser tools that can introduce negative effects such as stress-induced cracking of the wafer.

SUMMARY

According to an embodiment of a method of manufacturing a plurality of semiconductor devices on a wafer, the method includes forming a structure layer comprising a plurality of same semiconductor device structures and providing a protective layer on the structure layer. The protective layer on a first one of the plurality of semiconductor device structures differs from the protective layer on a second one of the plurality of semiconductor device structures.

According to an embodiment of a semiconductor device, the semiconductor device comprises a structure layer having a semiconductor device structure and a passivation layer on the structure layer. The passivation layer has an opening above a circuit element. A configuring substance is deposited in the opening that alters an electrical property of the circuit element.

According to an embodiment of a wafer for manufacturing a plurality of semiconductor devices, the wafer comprises a structure layer that includes a plurality of same semiconductor device structures and a protective layer above the structure layer. The protective layer above a first one of the plurality of same semiconductor device structures differs from the protective layer above a second one of the plurality of same semiconductor device structures.

According to an embodiment of a tool for use in manufacturing semiconductor devices on a wafer, the tool comprises a dispenser configured to selectively dispense a protective substance on the wafer.

According to an embodiment of a computer-readable medium for use in manufacturing semiconductor devices on a wafer, the computer-readable medium comprises data that causes a dispenser to selectively dispense a protective substance at a location on the wafer, wherein the data includes the location on the wafer.

The independent claims define the invention in various aspects. The dependent claims state features of embodiments according to the invention in various aspects.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention.

FIGS. 4A-4D illustrate top views of a configurable circuit element structure according to some embodiments.

Figure 1:
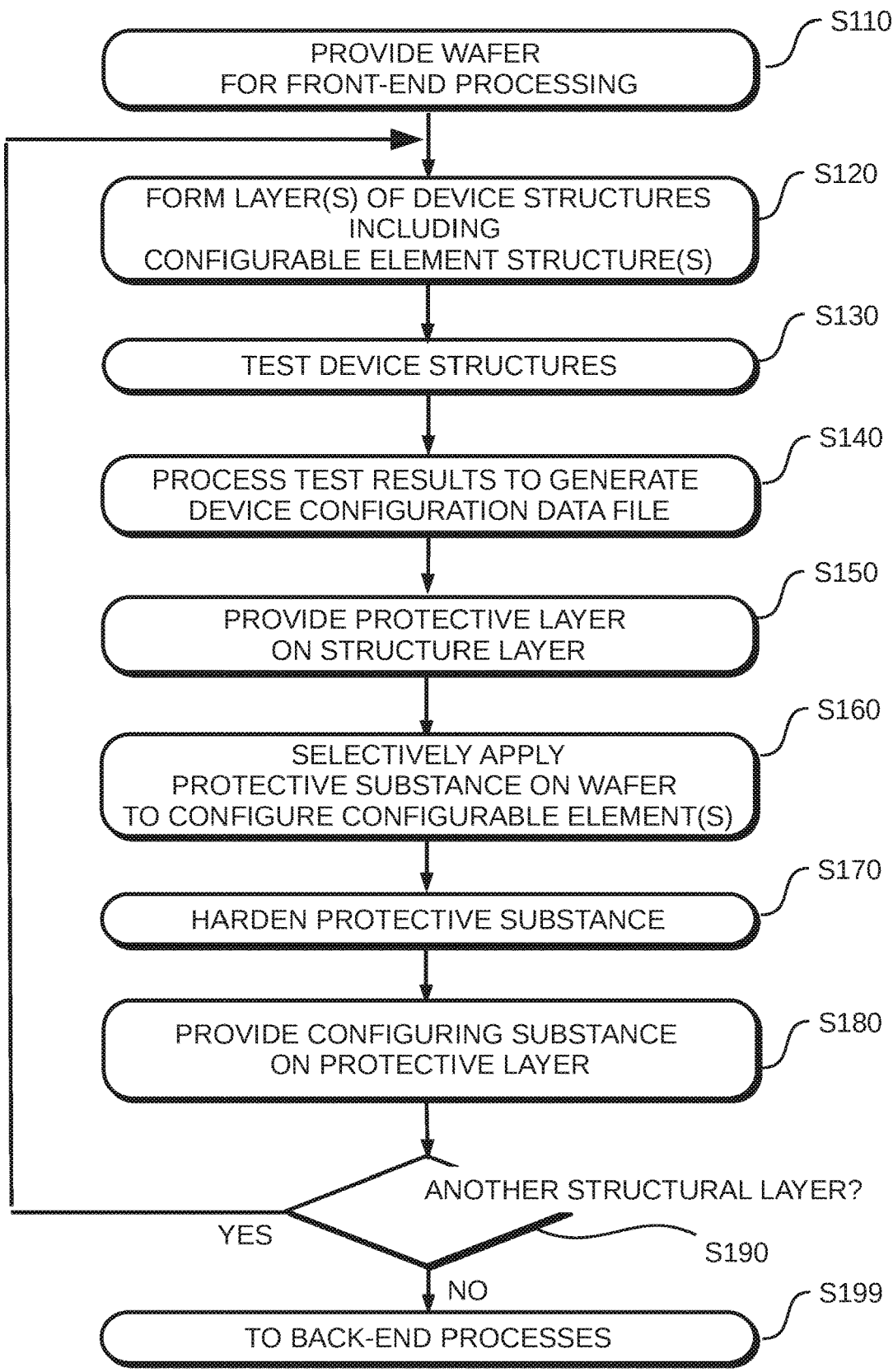
FIG. 1 illustrates a flowchart of a method according to some embodiments.

The elements of the drawings are not necessarily to scale relative to each other. Like reference numerals designate corresponding similar parts. Because components of embodiments according to the present invention can be positioned in a number of different orientations, directional terminology may be used for purposes of illustration that, however, is in no way limiting, unless expressly stated to the contrary. Other embodiments according to the present invention and many of the intended advantages of the present invention will be readily appreciated as they become better understood by reference to the following detailed description. It is to be understood that other embodiments may be utilized and structural or logical changes may be made without departing from the scope of the present invention. The following detailed description, therefore, is not to be taken in a limiting sense, and the scope of the present invention is defined by the appended claims.

DETAILED DESCRIPTION

Below, embodiments, implementations and associated effects are disclosed with reference to the accompanying drawings.

FIG. 1 illustrates a flowchart of a method according to some embodiments. The method can be used in manufacturing semiconductor device chips. The semiconductor chips may comprise various types of active and passive devices such as diodes, transistors, thyristors, capacitors, inductors, resistors, optoelectronic devices, sensors, micro-electro-mechanical systems, and others. In some embodiments, the semiconductor device chips comprise each one or more integrated circuits, one or more memories, an analog circuit, or a mixed signal circuit. In some embodiments, the semiconductor device includes a power transistor. In some embodiments, the semiconductor device includes a sensor. In some embodiments at least two of the afore-mentioned elements are combined in the semiconductor device chip, for example, to form a system chip.

Generally, a method for manufacturing a plurality of semiconductor devices on a wafer comprises forming a structure layer comprising a plurality of like semiconductor device structures. In some embodiments, the like semiconductor devices structures are all the same. An exemplary method according to some implementations will now be described with reference to FIG. 1 which shows a flow chart that illustrates the exemplary method.

At S110, the method comprises providing a wafer comprising a plurality of semiconductor device structures. The wafer can generally be provided for front-end processing as known in the art. In some embodiments, semiconductor device structures form a portion of an integrated circuit. The semiconductor device structures can be configured to form passive circuit elements such as resistance, inductance and capacitance. Further, the semiconductor device structures can be configured to form active circuit elements such as transistors. The skilled person will understand that, where the semiconductor device structure is provided to form an integrated circuit, a large number of passive circuit elements and active circuit elements can be included in a single semiconductor device structure. In one example, the semiconductor device structure is to go into a current sensor chip product.

At S120, the wafer is worked. One or more layers of device structures are formed. For example, a layer or layers including a layer with metal structures and/or a dielectric layer are formed to provide the plurality of semiconductor device structures. At least one effect can be to form, with each semiconductor device structure, a product, wherein the products thus formed are essentially of a same product type, for example, an integrated circuit die of the same type.

In some implementations, a first semiconductor device structure is associated with a first semiconductor device and a second semiconductor device structure is associated with a second semiconductor device to be separate from the first semiconductor device. In some implementations, the first semiconductor device structure and the second semiconductor device structure have a same device geometry. In other words, the first semiconductor device structure and the second semiconductor device structure have an identical layout.

In some implementations, the method can comprise, depending on the products to be manufactured with the wafer, for some or for each semiconductor device structure on the wafer, preparing the wafer for selectively receiving a conductive substance to form a configured circuit element on the wafer. As will be shown and discussed below, the semiconductor device structures are thus made to include structures of configurable elements that lend themselves to configuration or alteration according to the techniques disclosed herein. For example, a single configurable circuit element can be used in configuring digital and/or analog configurable elements such as tuning elements or to alter the digital and/or analog configurable elements.

In some embodiments, each semiconductor device structure comprises a first portion configured to provide a digital configurable element that is to form part of the integrated circuit. In some embodiments, each semiconductor device structure comprises a second portion configured to provide an analog configurable element that also is to form part of the integrated circuit. In some embodiments, the semiconductor device structure comprises both, the first portion and the second portion. While herein, for the sake of simplicity, reference is only made to one digital configurable tuning element, it should be understood that other configurable elements can be envisaged per semiconductor device structure. For example, a particular portion of the semiconductor device structure can be configured to perform certain signal processing or other function and, to this end, the portion can include a switching element to be formed in accordance with the present disclosure as set forth below with reference to configuring the tuning element. In some embodiments, where the semiconductor device structure is to form an integrated circuit, the integrated circuit comprises a first circuit portion and a plurality of second circuit portions, wherein the configurable circuit element is configurable to electrically connect the first circuit portion to a selected one or selected ones of the plurality of second circuit portions.

It should be understood that the act of providing the wafer for front-end processing, at S110, can comprise conventional front-end processing steps to form the plurality of semiconductor device structures. While the act of providing the wafer, at S110, and the act of working the wafer, at S120, to form configurable element structure(s) in the first portion and the second portion, are separately discussed as if to be performed one after the other, the sequence can be reversed and one act can form part of the other act. In particular, the act of forming the first circuit portion and/or the second circuit portion can precede or be included in the act of providing the wafer. For example, where the semiconductor device structure is to go into the current sensor chip product, the current sensor can be designed to include a meandering conductor structure that forms a resistance. The resistance can be made of a substance that has a lower conductivity than other conductor line material. The resistance can be embedded in different layers of the semiconductor device structure. In some implementations, the resistance can be designed as a tuning element configurable to compensate variations of a shunt resistance due to variations in front-end processing to the extent completed when configuring the configurable element.

At S130, the exemplary method further comprises testing the plurality of semiconductor device structures formed on the wafer. It should be understood that, while the testing can be limited to one semiconductor device structure or to a selection of the semiconductor device structures, for example to selected ones of integrated circuits, in some embodiments, testing is performed on each of the semiconductor device structures formed on the wafer. Further, it should be understood that the testing can be limited to a selected functionality and/or portion of the semiconductor device structure. For example, where the semiconductor device structure is to go into the current sensor chip product, the testing can include measurement of a shunt resistance.

At S140, the method further comprises generating a data file for use in control of a dispensing device configured to dispense a protective substance. In some implementations, test results are processed, for example, using a test device data processor. In some implementations, the exemplary method further comprises, based on a test result, deriving a selected circuit element on the wafer to be configured.

For example, where semiconductor device structures are to go into current sensor chip products, the processing can include a comparison of the measured shunt resistance values to a target resistance value. The data processing can be performed to calculate a desired tuning resistance value that depends on the difference between the target resistance value and the measured shunt resistance value in the tested device. In particular, the data processing can be performed to identify one or more locations where the meandering conductor structure should be bridged by a conductive bridge that effectively short-circuits the bridged meander or open loop of the meandering structure. It should be understood that, from one semiconductor device structure to another, on the same wafer, different shunt resistance values can be measured and, accordingly, different locations to bridge the meandering conductor structure can result.

In another example, data represent information that is individually associated with one semiconductor device such as the very semiconductor device that is to include the semiconductor device structure under test. For example, a digital representation of the measured value can be determined. In some embodiments, the information is based on the test result. In some embodiments, the locations for selectively providing the substance on the selected portion of the wafer encode the information associated with the tested semiconductor device structure. To give one example of a digital configurable element, the digital configurable element can be configurable to represent a desired value in accordance with the digital representation of the measured value that was determined when processing the test result. At least one effect can be that, when further processing the wafer, digital printing methods can be used, which allow an application of flexible and/or individual print files and/or structures that can be generated for each chip individually, based on the measurement data.

The data file can be adapted to for use in configuring the selected circuit element. For example, the data file can include data to be used in control of a tool and representative of location information associated with a location of the selected circuit element on the wafer.

At S150, the exemplary method comprises providing a protective layer above on the structure layer. In some implementations, the protective layer is a passivation layer. In some implementations, the protective substance is a passivating substance. In some implementations, the protective layer is configured to resist a predetermined reactant. In some implementations, the protective layer is a photo resist layer.

Generally, the protective layer on a first semiconductor device structure can be made to differ from the protective layer on a second semiconductor device structure. In some implementations, providing the protective layer comprises forming a base protective layer having a plurality of same openings above the plurality of semiconductor devices. In particular, the openings each expose one configurable element of the respective semiconductor device structure. The base layer is the same for same semiconductor device structures in the structure layer. For example, the first semiconductor device structure and the second semiconductor device structure being identical both can be provided with a same base protective layer. The base protective layer provides a mask, for example a photoresist mask, which is the same above each of the semiconductor devices.

At S160, the method further comprises individualizing the protective layer for each semiconductor device structure. The method can comprise selectively depositing protective substance in an opening of the base protective layer. In some implementations, a dispensing device is used that is configured to perform printing or spraying. For example, the dispensing device is an inkjet printing device, a nozzle spraying device or an electro spraying device. In some implementations, providing the base protective layer and providing the protective substance selectively over selected configurable circuit elements is performed in a single act. For example, a spraying device can be used to spray the protective substance.

In some implementations, the dispensing device is provided as a plasma source configured to form a plasma to deposit charged particles on the structure layer. For example, a substance, for example held in a reservoir or channel of a dispenser tool, is provided on a selected portion of the wafer to selectively deposit the substance in the opening of the base protective layer above a configurable element of the respective semiconductor device structure.

In some implementations, a smallest extension of a diameter or cross section of the area covered by the substance at the selected portion of the wafer is about one hundred micrometer or less than one hundred micrometer, for example, about ten to twenty micrometer, wherein, for example, the semiconductor device is a power transistor. In some implementations, a smallest extension of a diameter or cross section of the area covered by the substance at the selected portion of the wafer is about one micrometer to ten micrometer, wherein, for example, the semiconductor device is a power transistor device and the substance is for use in connecting a sensor element to the power transistor. In some implementations, a smallest extension of a diameter or cross section of the area covered by the substance at the selected portion of the wafer is about one micrometer or less than one micrometer. For example, in one implementation an approximately rectangular area of about 2 µm×130 nm is covered; in another example, an approximately circular area having a diameter of approximately 1 µm, 500 nm, 250 nm or 130 nm is covered.

In some implementations, a micro-forming technique is used. Where the substance is a paste, the dispenser can be provided, for example, as an extruder. For example, the dispensing device is provided as an extruder configured to micro-extrude a plastic substance to deposit the same on the semiconductor device structure.

The act of printing the substance can include heating the liquid, for example while keeping the liquid in a reservoir prior to dispensing the liquid, so as to keep the liquid fluid. In some embodiments, the method comprises ejecting the substance from the reservoir. In some embodiments, the method comprises providing the liquid in a cavity, sponge or other reservoir coupled to a dispenser. The dispenser, for example, can be provided as a nozzle. The act of ejecting the substance from the reservoir can include increasing a pressure inside the cavity by moving a cavity wall to reduce a cavity volume and/or by heating the liquid inside the cavity, and ejecting the liquid through the dispenser. In some embodiments, the liquid is dispensed in accordance with control signals provided to an actuator that can deform the reservoir. The control signals can be provided so as to direct dispensed substance to the selected portion(s) on the wafer, while keeping other portions free from the dispensed substance. In some embodiments, the method comprises electrically charging the substance ejected from the reservoir and controlling an electric field to direct the substance. Accordingly, some embodiments comprise, after measuring the device, selectively introducing printed structures on the semiconductor device structure. At least one effect can be that chip-individual structures can be formed to achieve results optimized individually for selected chips. Available printing technologies encompass, but are not limited to, inkjet printing as well as digitally controllable methods of nozzle spraying or electro spraying.

In some embodiments, the protective substance, at the time of providing the substance, is at least one selected from the group consisting of a liquid, a suspension in a liquid, and a paste. For example, a protective substance to complete the protective layer is one or more from the group of protective substances consisting of: photo resist, imide, acrylate, hot-melt or epoxy.

In some implementations, laser direct imaging (LDI) is used to form, based on the data file, the protective layer which is individual for each of the semiconductor devices. In some embodiments, based on the data file, a programmable lithographic mask or a maskless aligner (MLA) is used to form the protective layer which is individual for each of the semiconductor devices.

In some implementations, at S170, the wafer is treated to fixate the protective substance. In particular, the protective substance is hardened. The print can be applied as a short-connection in a meander structure, for example, on an unstructured support surface or the print can be provided on predetermined locations, which have a guiding structure such as cavities and/or trenches suitable to be filled with ink.

At S180, the method further comprises applying a configuring substance on the protective layer. In some implementations, the configuring substance is conductive. At least one effect can be that the configuring substance effectively configures as a conductor element such a circuit element that is located in an opening of the protective layer and therefore exposed to the configuring substance.

In some implementations, the configuring substance is configured to become conductive when provided in the opening of the base protective layer. For example, the configuring substance comprises a metal. In some embodiments, the configuring substance is a metal. For example, the liquid can be a metal heated above the metal's melting temperature. In another example, the liquid can be a conductive resin, for example, a resin mixed with a powder of conductive particles so as to provide a conductive liquid. For example, the substance can be a solution that contains conductive particles. In some embodiments, the solution evaporates leaving behind the conductive particles. In still another embodiment, the substance is a conductive paste. In some implementations, an ink or other substance is used that comprises metal particles.

Thus, substances to be deposited can encompass, but are not limited to, metal inks, such as nano-particle containing inks, or chemical metal precursor inks that lead to electrically conducting layers and/or structure. For example, a nano-particle ink can be used. The nano-particle ink can contain metal particles. In some implementations, metal particles contained in the nano-particle ink can have a size of less than a micrometer, down to a few nanometers such as between 100 and 500 nm, preferably 100 and 200 nm, or even less, such as between 10 and 100 nm. Depending on a desired resistivity of the added structure, pure metals can be applied selected, for example, from a group consisting of Cu, Ag, Au, Ni, Sn and In, or systems can be applied that lead to specific alloys, e.g., mixtures of the afore-mentioned metals. Other electrically conducting materials can also be used, either alone or in addition, such as metal oxides, conducting organic polymers or mixtures of them with metal particle.

In some implementations, the selected circuit element comprises a non-conductive receptacle. At least one effect can be that a guiding structure is provided to guide flow of the reactant on the wafer surface. In particular, the guiding structure can be adapted to guide the flow of the reactant onto the conductive coupling of the selected circuit element. The substance can comprise one or more reactant in a group consisting of an etchant, a solvent, an oxidizing agent, a complex-forming agent. In particular the reactant can be selected to break the conductive coupling of the selected circuit element.

At least one effect can be that, despite being deposited on a wide area of the wafer, in some embodiments, being deposited globally across the wafer, the configuring substance can configure those configurable elements of the semiconductor device structure that are not protected by the protective layer and therefore can be exposed to the configuring substance. Since the openings can be formed, as described above, individually for each semiconductor device structure, the configuration of the semiconductor device structures on the wafer can also be individual to each semiconductor devices structure. Using an etchant as the configuring substance, for example, conductive material can be removed in order to interrupt a metal conductor line as the configurable element that is exposed to the configuring substance. At least one effect can be that as much conductor line material can conveniently be etched as is required for a safe separation of the line terminals facing one another. Thus, in operation of the semiconductor device, a risk of damage due to leakage current or arching is reduced when compared to a conventional laser fuse which, when operated at sufficiently low energy to avoid an excess of stress on the semiconductor device, remove only a small volume of material and are prone to form pointed conductor surfaces.

In some implementations, the configuring substance, once applied to the semiconductor device structure, can be subject to further processing depending on the configuring substance, for example, exposure to ultraviolet radiation so as to cure, to microwave radiation so as to react, infrared radiation so as to have a solvent evaporate, and so forth.

Generally, a hardening step can be applied in order to convert deposited material, be it protective substance or configuring substance, into a final desired form of the protective layer and the configured element, respectively. This can be a drying step to remove solvent and/or a sintering step. Energy can be provided in various ways: Baking the wafer, for example in an oven and/or exposing the wafer surface to radiation can be used. For example, where the liquid is resin, the wafer can be exposed to radiation of a predetermined spectrum such as infrared radiation or ultraviolet radiation as required to cure the particular resin used in the process. In some implementations, high energy Xe-flash lamps or laser radiation is used. In one example, where the liquid is a metal, the wafer is cooled below the melting point of the matter. In some embodiments, the act of hardening the substance comprises curing the substance. One effect can be that the substance becomes solid. In yet another example, where the substance is a paste, the wafer may be heated in order to bake the paste. It should be understood that the act of hardening the substance to become solid can include evaporation of a part of the substance such as, for example, evaporation of a solvent comprised in the substance.

In some implementations, once the configuring substance firmly configures the configurable elements, for example, in accordance with control data represented in the data file discussed above, one or more other acts can be performed such as an act of removing the protective substance from the wafer and an act of cleaning the wafer from impurities that could pose an impediment to further process steps or otherwise compromise product quality. For example, the wafer having the protective layer can be rinsed.

Still at S180, in some implementations, the configurable element is passivated. For example, the method can comprise selectively providing a dielectric at least on the selected portion(s) of the wafer that received the conductive substance. At least one effect can be that the dielectric passivates the freshly formed tuning element. In some implementations, further process printing steps can be performed in order to selectively provide a deposition of passivating substance.

In some implementations, at S190, it is determined if further front-end processing is needed to complete the semiconductor device structures and, for example, another structured device layer should be formed on the wafer. If so, the wafer can, once again, be subjected to the above-described processes, whereby at least one more structural layer is provided on the wafer. In that case, some or all of the steps described above can be undergone again; for example, the process can move on to form, at S120, another layer of device structures and to continue from there. If, in contrast, completion of front-end processing of the wafer is thus determined, at S199, the method may proceed to other processes. For example, the method can move on to perform a back-end process. For example, dicing can be performed to separate semiconductor dice from the wafer that include the configurable element(s) being individually configured as described above.

As described above, in some implementations the method for use in manufacturing semiconductor devices comprises testing the wafer. This wafer can have a plurality of semiconductor device structures in at least a first structural layer on the wafer. The method further comprises adding another structural layer on the wafer, whereby further circuit elements are completed and/or added. In some implementations, the act of adding another structural layer includes a lithographic process. The method comprises, between the acts of testing the wafer and adding another structural layer on the wafer, providing a protective layer comprising a protective substance on the structure layer. In some implementations, the method comprises selectively providing the protective substance on the wafer at a selected location on a selected portion of the wafer comprising one semiconductor device structure. In particular, the act(s) of selectively providing the protective substance on the wafer can be performed before having performed the lithographic process. The method, in some implementations, comprises performing the lithographic process. Where the structure layer is not covered by the protective layer, the structure layer is exposed to the lithographic process. The lithographic process alters those portions of the structure layer that are exposed to the lithographic process, thereby, altogether, rendering an altered wafer. The altered wafer has, based on the test result, at least one selected portion altered.

At least one effect can be that, in the process of individualization, the semiconductor device is exposed to less thermal and/or mechanical stress than in a case where a laser fuse is used.

Generally, a semiconductor device comprises a structure layer having a semiconductor device structure and a protective layer on the structure layer. The protective layer may, for example, be provided as a passivation layer on the structure layer. In some embodiments, an intermediate layer other than the passivation layer may be formed on the structure layer. In such a case, strictly speaking, the passivation layer is not formed directly on the structure layer, but above the structure layer. However, in some embodiments, the intermediate layer has a functional relation to forming the passivation layer. For example, the intermediate layer may function as a seed layer that enables built-up and/or adherence of the passivation layer on the structure layer.

In some embodiments, the protective layer has an opening above a circuit element. In some embodiments, a configuring substance is deposited in the opening that alters an electrical property of the circuit element.

One example of an embodiment can be: Forming an interrupted conductive line on a semiconductor device structure for use in a chip, providing a window opening surrounding this interruption in the protective layer covering this line, and, at least partially, filling this window opening with a conductive ink using a printing technique such that the interrupted halves are electrically connected.

FIGS. 2A-2E illustrate a perspective and cross-sectional views of a configurable circuit element structure 200 according to some embodiments. In various embodiments, the configurable circuit element structure 200 includes a conductor line 220, for example a metal line (e.g. copper, aluminum or their alloys in embodiments) which has a gap that interrupts the line to form an interrupted conductor line 220 and impedes current flow in the line. The structures are passivated e.g. by using a suitable technology, such as photo imide, and the metal gaps are left unpassivated. Suitable passivation material (e.g. imide, epoxy, acrylate, ceramic, silicone in various embodiments) is deposited via inkjet on the metal gaps where open gaps are required. After the deposition of protective material, a suitable process such as an electroless deposition process is used to bridge the gap and thus connect the line in the configurable circuit element structures 200 where the protective material was not deposited.

Figure 2A:
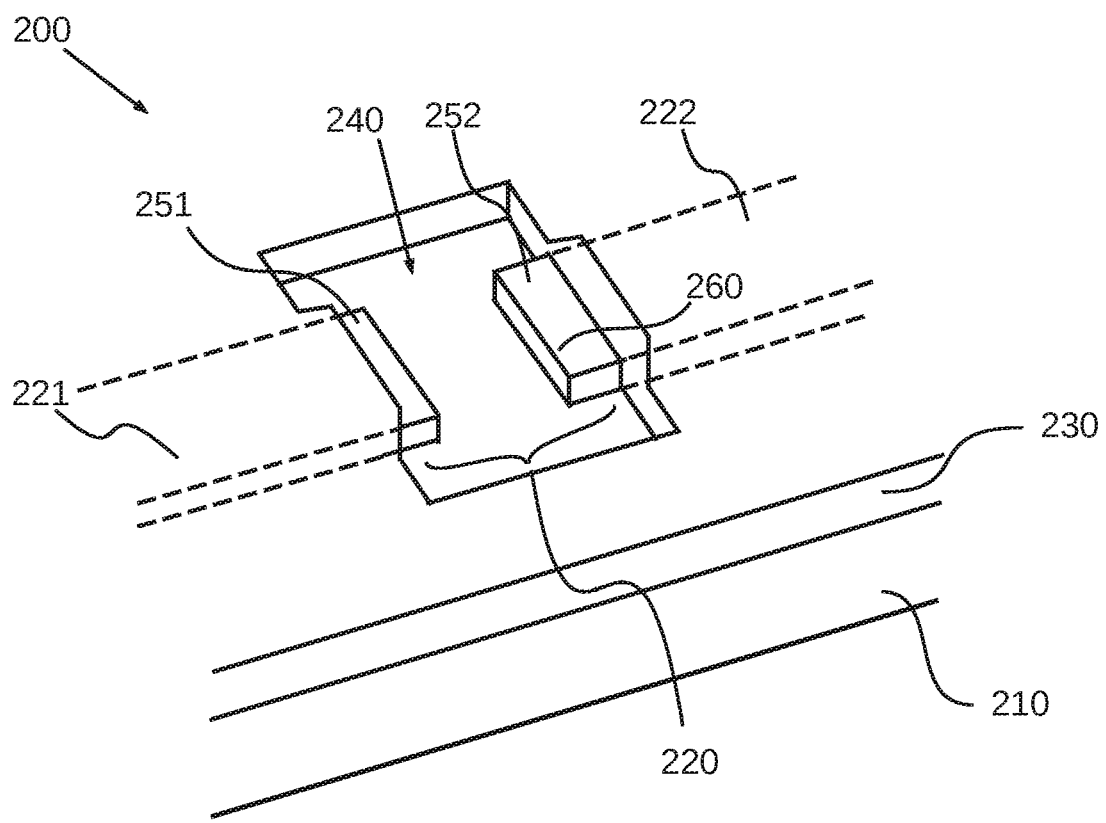
FIGS. 2A-2G illustrate a perspective and cross-sectional views of a configurable circuit element structure according to some embodiments.

FIG. 2A illustrates a perspective view of the configurable circuit element structure 200 according to some embodiments. The configurable circuit element structure 200 can, for example, result from performing processing steps as described above. In particular, in some implementations, the configurable circuit element structure 200 as illustrated can form part of semi-finished product after completion of step S150 described above. On a substrate 210, a first metal line 221 and a second metal line 222 are provided. The first metal line 221 and the second metal line 222 are coaxially aligned such that a terminal end 251 of the first metal line 221 faces a terminal end 252 of the second metal line 222 spaced apart from one another by a gap. In some embodiments, the gap is approximately as wide as the width of the first metal line 221 and/or the width of the second metal line 222. Thus, the ensemble of the first metal line 221, the gap and the second metal line 222 forms an interrupted conductor line 220. Atop the interrupted conductor line 220, in the example, a protective layer 230, such as an oxide layer 230, can be deposited. In the protective layer 230, a window opening 240 is formed above the interrupted conductor line 220 such that the terminal end 251 of the first metal line 221 and the terminal end 252 of the second metal line 222 are exposed within the window opening 240 to form a pair of conductive landings or a metal gap.

Figure 2B:
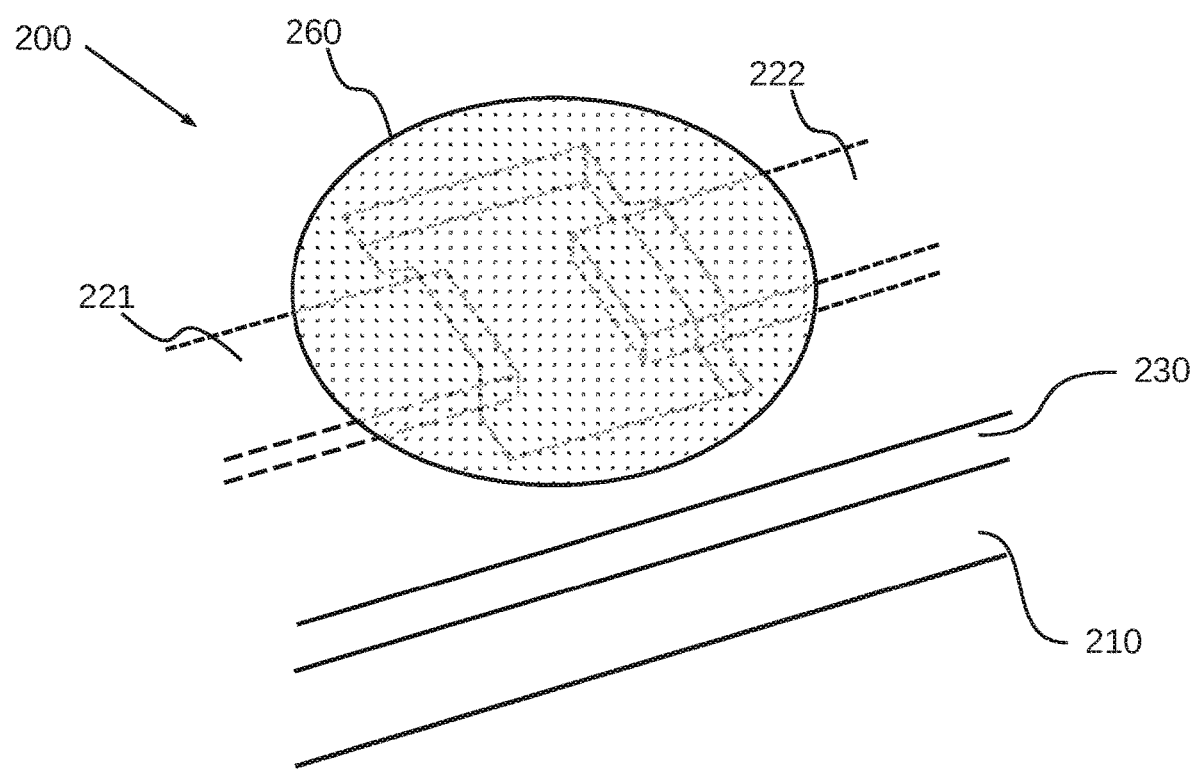

FIG. 2B illustrates a perspective view of the configurable circuit element structure 200 discussed above with reference to FIG. 2. In particular, in some implementations, the configurable circuit element structure 200 as illustrated can form part of semi-finished product at a stage after completion of step S160 described above. Over the window opening 240, at the interruption of the interrupted conductor line 220, a quantity of protective substance 260, essentially centered in the gap between the terminal ends 251, 252, extends to cover at least a portion of both terminal ends 251 and 252 and, thus, covers the interruption caused by the gap between the terminal ends 251, 252. At least one effect can be that a subsequent process step does not affect electrical properties of the interrupted conductor line 220. In particular, the interruption can lastingly electrically isolate the first metal line 221 from the second metal line 222. In various embodiments, suitable passivation materials such as imide, epoxy, acrylate, ceramic, or silicone can be deposited on the metal gaps where open gaps are required. Thus, any subsequent deposition of a layer of conductive material does not configure the configurable element. In particular, the gap is not bridged. Instead, the interrupted conductor line 220 forms a very high resistance element. The quantity of protective substance 260 extends to cover at least a portion of both terminal ends 251 and 252 and covers the interruption caused by the gap between the terminal ends 251 and 252 and electrically isolates the first metal line 221 from the second metal line 222.

Figure 2C:
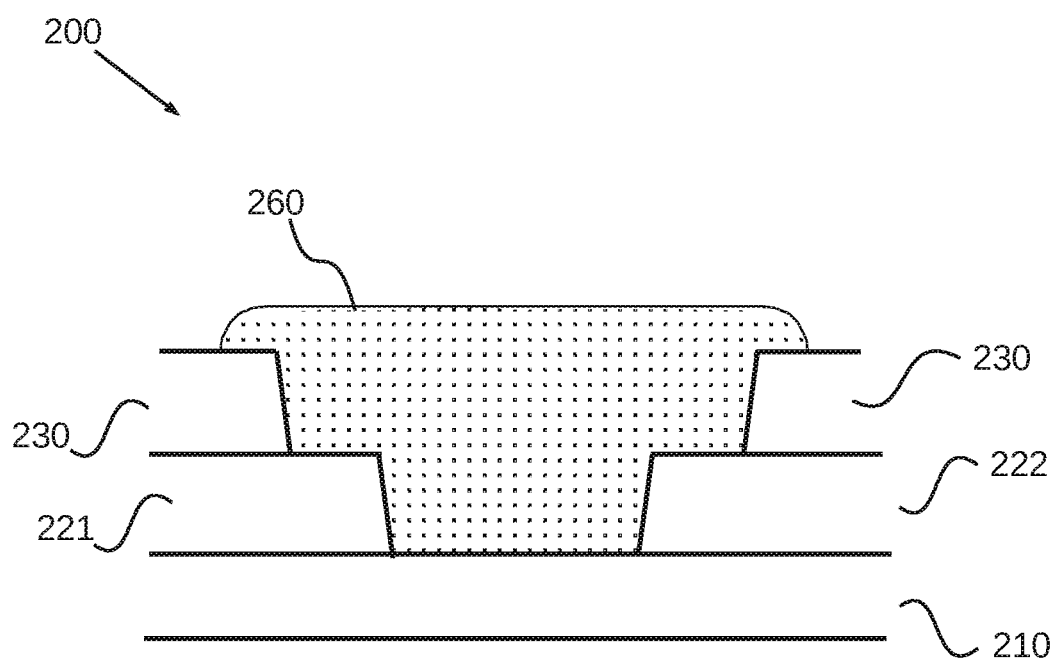

FIG. 2C illustrates a cross-sectional view of the configurable circuit element structure 200 illustrated in FIG. 2A. The quantity of protective substance 260 is essentially centered in the gap between the terminal end 251 of first metal line 221 and terminal end 252 of second metal line 222. Protective substance 260 extends to cover at least a portion of both terminal ends 251 and 252. Thus, the protective substance 260 fills the gap and covers the interruption caused by the gap between the terminal ends 251, 252 to electrically isolate the first metal line 221 from the second metal line 222.

Figure 2D:
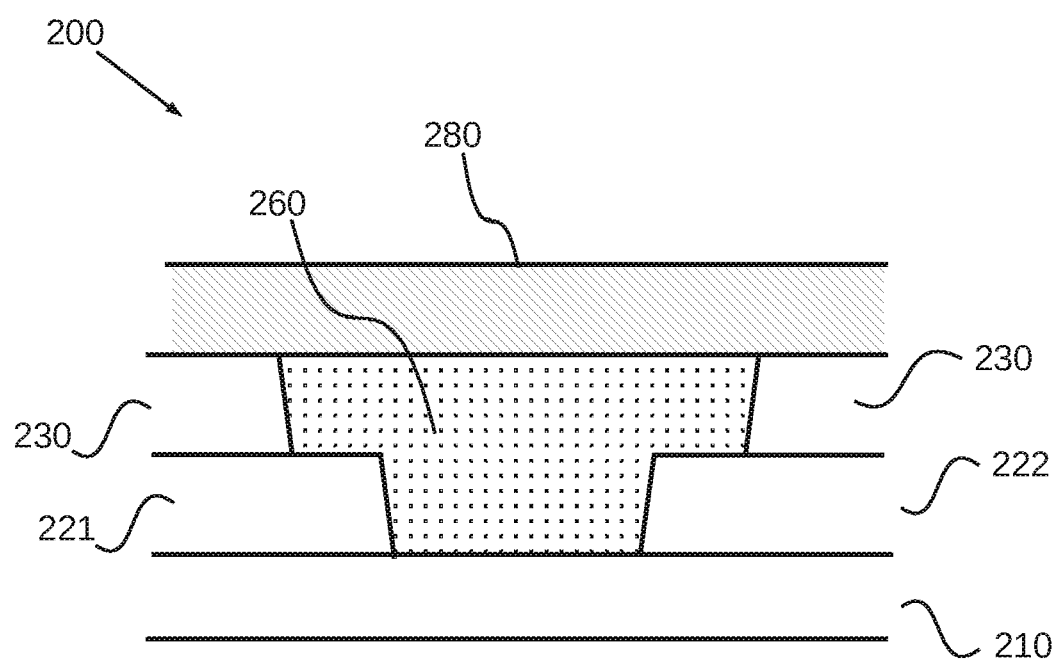

FIG. 2D illustrates a cross-sectional view of the configurable circuit element structure 200 illustrated in FIG. 2C. The protective substance 260 can be hardened as described above with reference to act S170 in the method illustrated in FIG. 1. In some embodiments, the protective substance 260 is planarized such that the surface of the protective substance 260 is coplanar with the surface of the protective layer 230. In some embodiments (not shown), a further layer or further layers of substance can be deposited on the protective layer 230 and the protective substance 260 and other process steps be performed. For example, a metal layer can be deposited. At least one effect can be that the semiconductor device structure is further built to complement the semi-finished product and, thereby, provide a finished product with the semiconductor device. Thus, the passivation layer 280 protectively covers the semiconductor device structure. In some embodiments, a passivation layer 280 is deposited on the semiconductor device structure. In some embodiments, as shown in the example illustrated in FIG. 2D, the passivation layer 280 is deposited on the surface of the protective layer 230 and the surface of the protective substance.

Figure 2E:
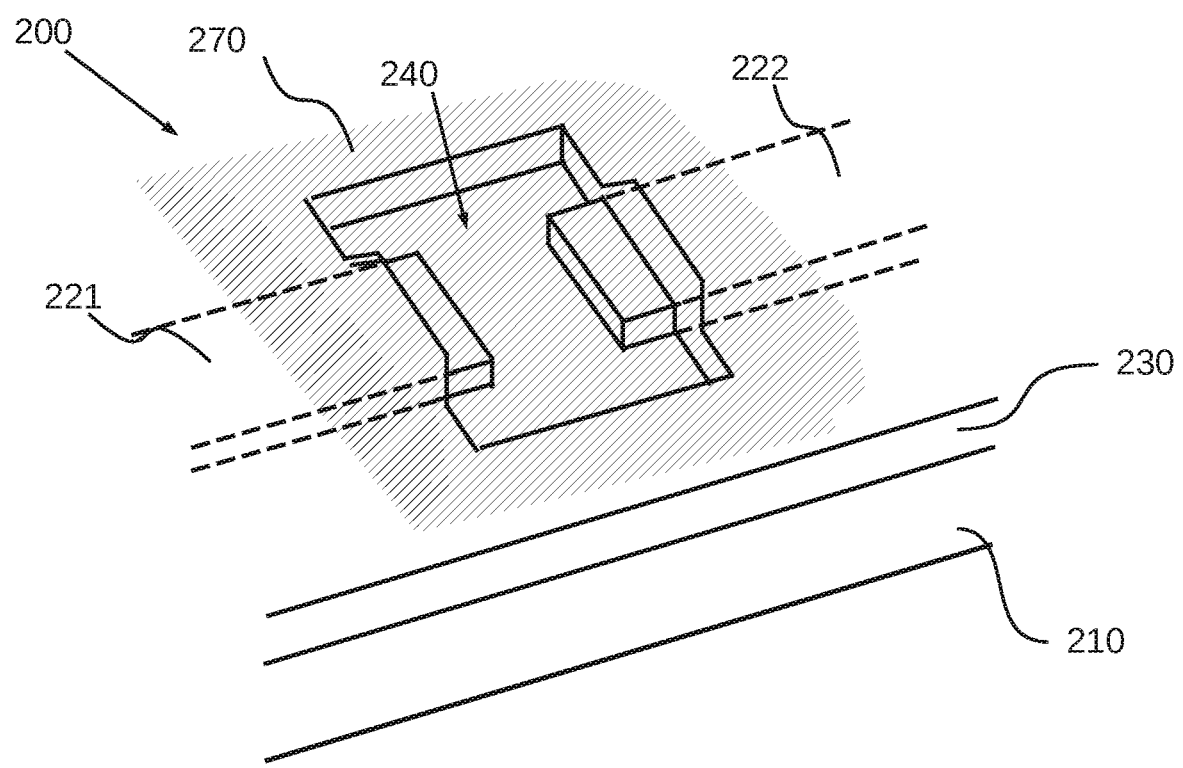

FIG. 2E illustrates a perspective view of another embodiment based on the configurable circuit element structure 200 as discussed above with reference to FIG. 2A. In particular, in some implementations, the configurable circuit element structure 200 as illustrated can form part of semi-finished product after completion of step S180 described above. The exemplary configurable circuit element structure illustrated in FIG. 2E differs from the configurable circuit element structure illustrated in FIGS. 2B-2D in that no protective substance fills the window opening 240 in the protective layer 230.

In particular, FIG. 2E illustrates the configurable circuit element structure of FIG. 2A after a deposition of a layer of conductive material on the protective layer 230 and in the window opening 240. In various embodiments, for example, a suitable process such as an electroless deposition process can be used to connect the metal lines with a conductive substance 270 in the configurable circuit element structures where the protective material was not deposited. It should be understood that, while FIG. 2E merely shows a patch of the conductive substance 270, in some embodiments, the conductive substance 270 is provided globally as a layer on all of the wafer. Since, in contrast to the configurable circuit element shown in FIG. 2B, in the embodiment illustrated in FIG. 2E, the window opening 240 was not filled with a protective substance 260, any subsequent deposition of a layer of conductive material configures the configurable circuit element to become conductive. A conductive substance illustrated at the interruption of the interrupted conductor line 220 essentially fills the window opening 240 and, in particular, the gap between the terminal ends 251, 252. The conductive substance of the conductive layer 270 enters in the gap between the first metal line 221 and the second metal line 222 and, thereby, bridges the interruption caused by the gap between the terminal ends 251, 252 to electrically connect the first metal line 221 and the second metal line 222 to one another. Thus configured, the conductor line 220 forms a conductive element.

Figure 2F:
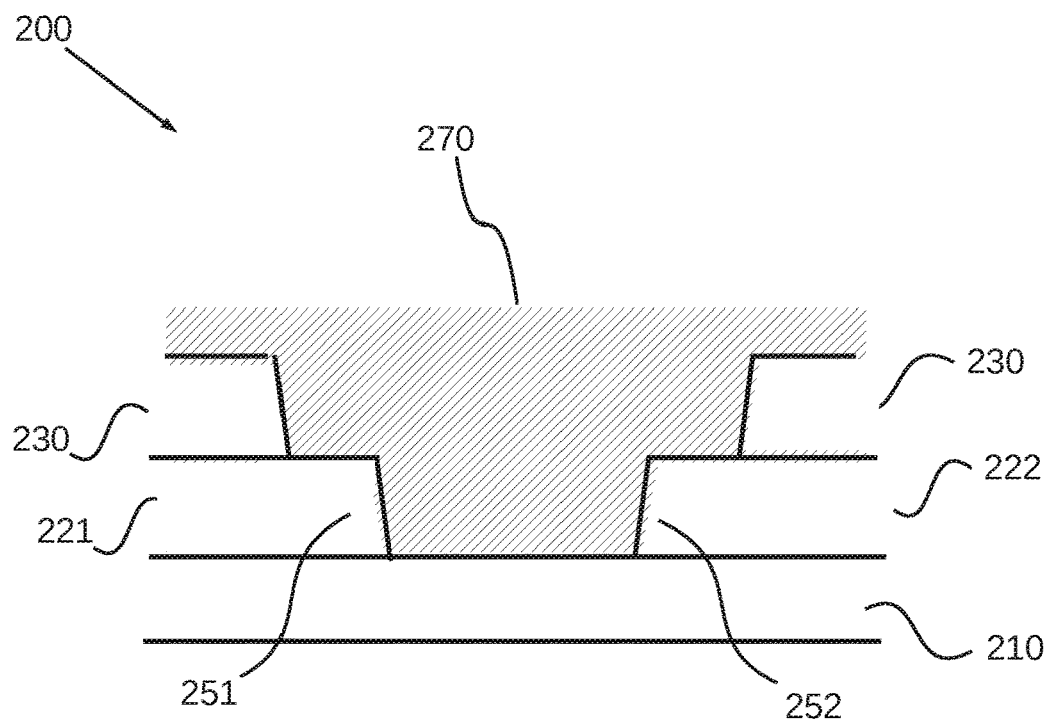

FIG. 2F illustrates a cross-sectional view of the configurable circuit element structure 200 illustrated in FIG. 2E. The conductive substance 270 is essentially centered in the gap between the terminal end 251 of first metal line 221 and terminal end 252 of second metal line 222 and electrically connects the first metal line 221 to the second metal line 222.

Figure 2G:
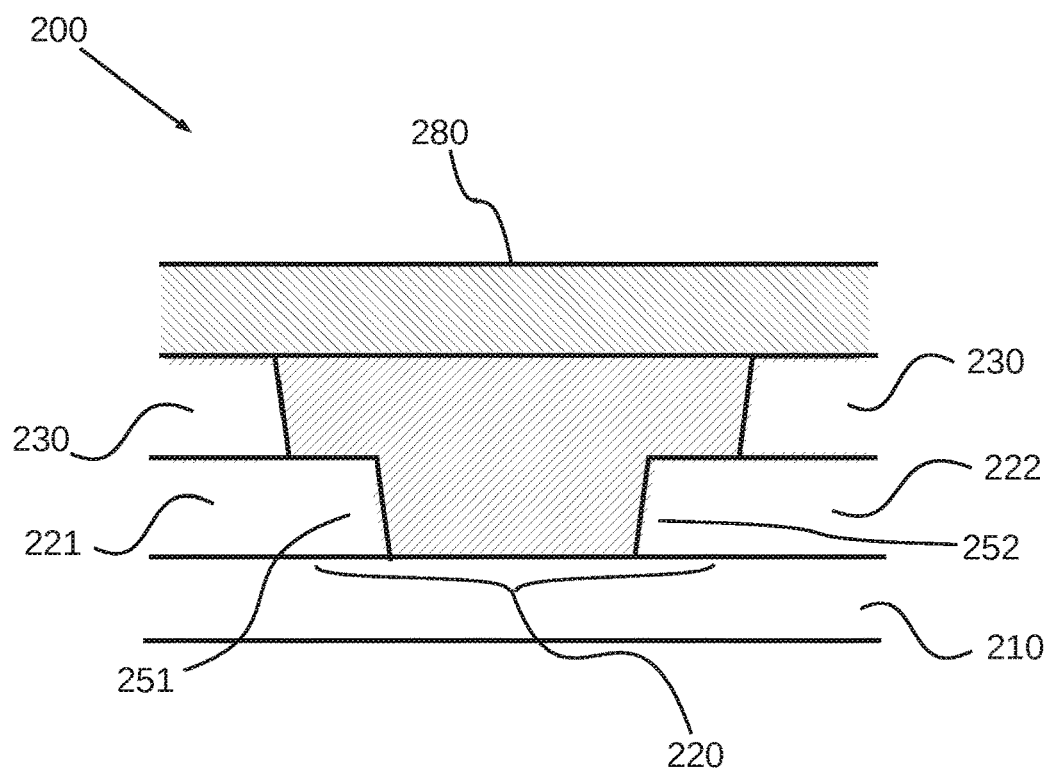

FIG. 2G illustrates a cross-sectional view of the configurable circuit element structure 200 illustrated in FIG. 2F. The conductive layer is largely removed, for example using a planarization technique. However, still, the conductive substance 270 fills the window opening 240 in the protective layer 230 and the gap between the terminal end 251 of first metal line 221 and terminal end 252 of second metal line 222 and, thus, electrically connects the first metal line 221 to the second metal line 222 to complete the conductor line 220 and thus form the conductive element. A passivation layer 280 is deposited on the semiconductor device structure and protectively covers the semiconductor device structure.

FIGS. 3A-3D illustrate a cross-sectional views of a configurable circuit element structure 300 according to some embodiments. FIGS. 4A-4D illustrate top views of the configurable circuit element structure 300 illustrated in FIGS. 3A-3D according to some embodiments. In various embodiments, the structure includes metal lines 321 and 322 which are connected, respectively, to vias 353 and 354. For each circuit element structure, vias 353 and 354 are conductively connected via a conductive layer 370 (e.g. copper, aluminum or their alloys in some embodiments). A base protective layer 330 (such as a resist mask in some embodiments) is deposited over the structures. The base protective layer 330 includes openings 340 over vias 353 and 354 for each configurable circuit element structure 300. After the deposition of the base protective material 330, a protective substance 360 is deposited over openings 340 where conductive connections between vias 353 and 354 for corresponding configurable circuit element structures 300 are desired. A standard etching process (wet chemical or dry etching in some embodiments) will disconnect the metal lines 370 where the protective substance 360 was not deposited.

Figure 3A:
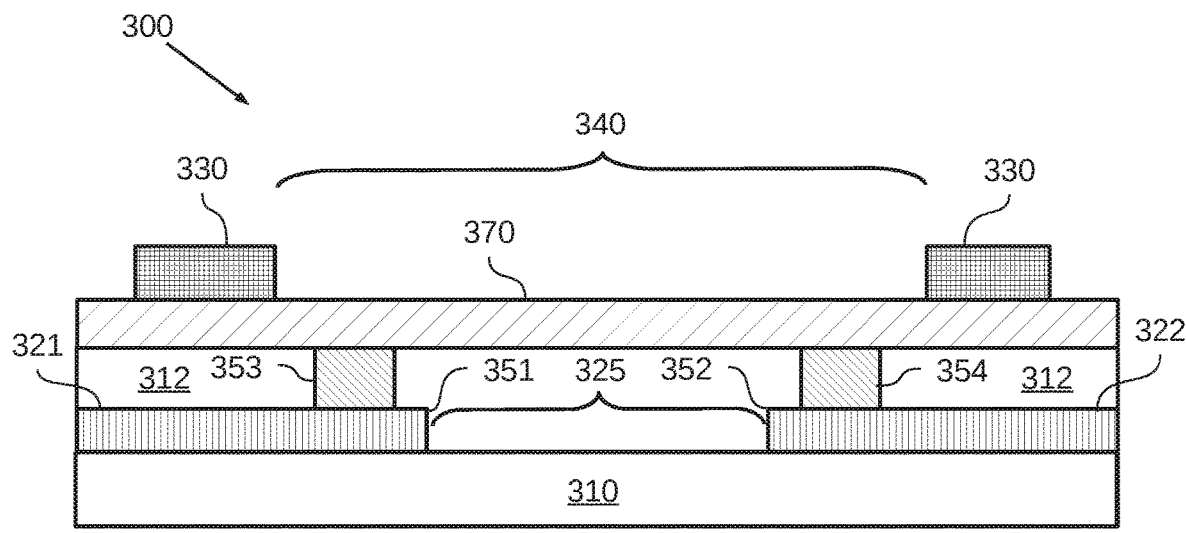
FIGS. 3A-3D illustrate cross-sectional views of a configurable circuit element structure according to some embodiments.

FIG. 3A and FIG. 4A illustrate a cross-sectional and top views of a configurable circuit element structure 300 according to some embodiments. The configurable circuit element structure 300 can, for example, result from performing processing steps as described above. On a substrate 310, a first metal line 321 and a second metal line 322 are provided. The first metal line 321 and the second metal line 322 are coaxially aligned such that a terminal end 351 of the first metal line 321 faces a terminal end 352 of the second metal line 322 that are spaced apart from one another by a gap illustrated at 325. In some embodiments, the gap 325 is approximately as wide as the width of the first metal line 321 and/or the width of the second metal line 322. A first via 353 sits atop first metal line 321 and a second via 354 sits atop second conductor line 322. A conductive layer 370 is formed over first via 353, second via 354 and an oxide layer 312. First via 353 conductively couples first metal line 321 to conductive layer 370. Second via 354 conductively couples second metal line 322 to conductive layer 370. Conductive layer 370 couples via 353 to via 354. Next a base protective layer 330 is formed over the conductive layer 370. The base protective layer 330 includes a window opening 340 that extends over vias 353 and 354 for each circuit element structure 300. Base protective layer 330 is illustrated as providing a window frame around opening 340. In other embodiments (not shown in FIG. 3A and FIG. 4A), base protective layer 330 can cover an entire wafer, for example, with only windows 340 over corresponding configurable circuit structures 300 being open.

Figure 3B:
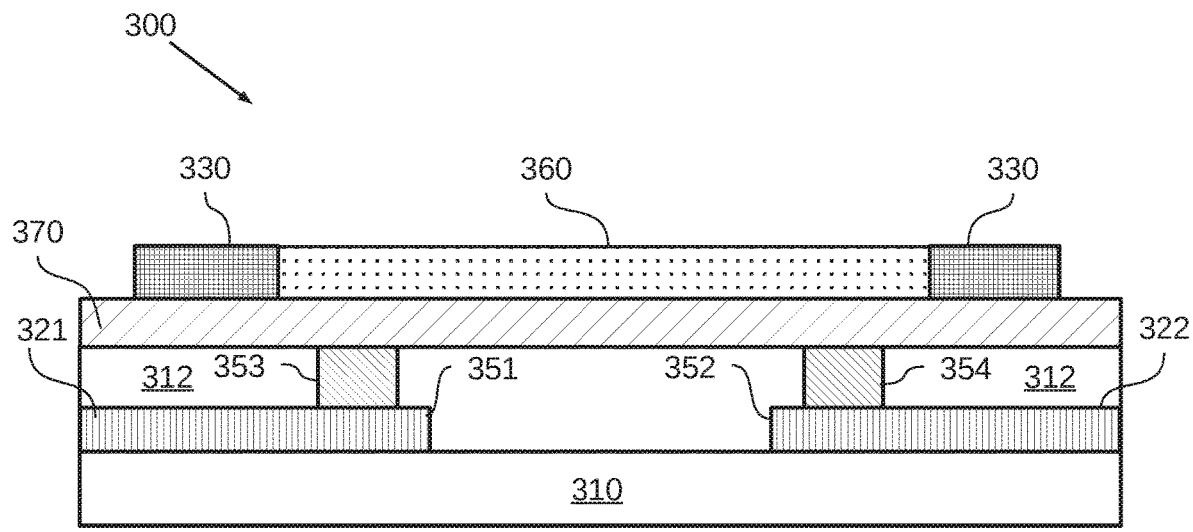
Figure 3C:
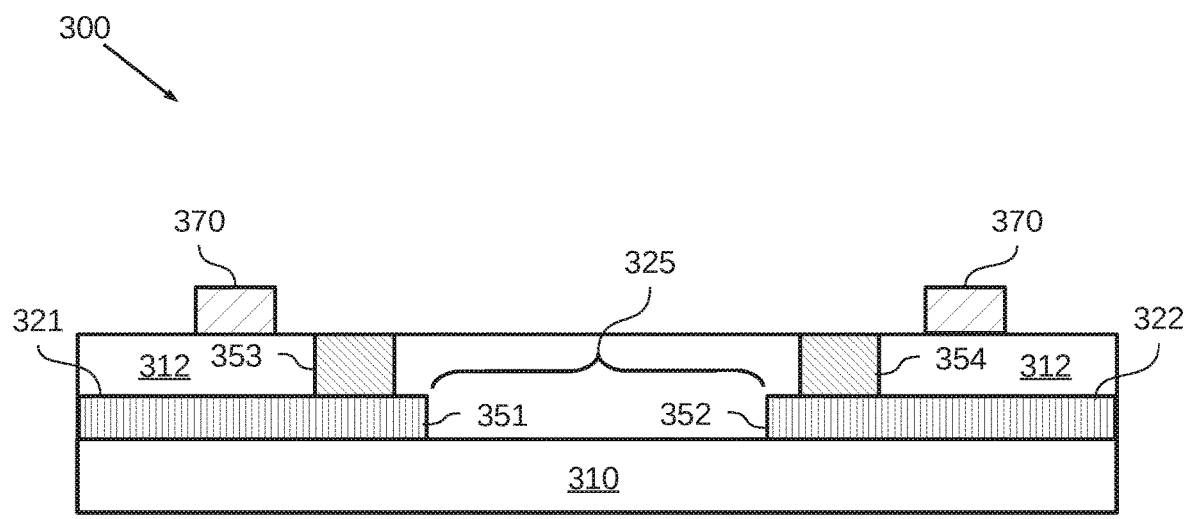

Referring to FIG. 3C and FIG. 4C, by selective application of a configuring substance over base protective layer 330, wherein the configuring substance is, for example, an etchant, conductive layer 370 is etched and disconnects via 353 from via 354. In this embodiment, the etching process (wet chemical or dry etching in some embodiments) will disconnect metal lines 370 where the protective layer 360 was not deposited. In some embodiments, the configuring substance comprises one or more reactants from a group of reactants consisting of an etchant, a solvent, an oxidizing agent and a complex-forming agent.

Figure 3D:
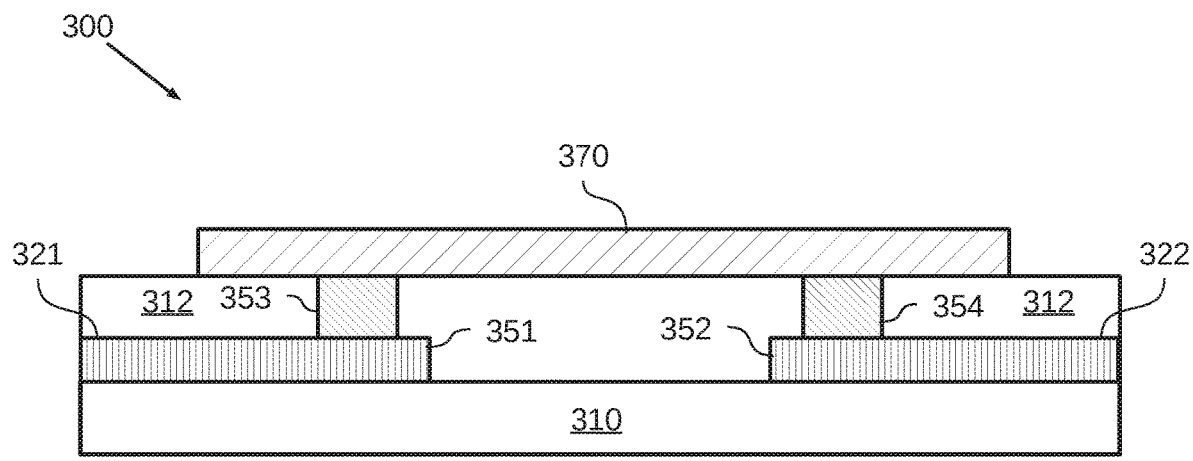

FIG. 3B and FIG. 4B illustrate a cross-sectional and top views of a configurable circuit element structure 300 according to some embodiments. Configurable circuit element structure 300 has a protective substance 360 deposited within the window opening 340 of the base protective layer 330. Referring to FIG. 3D and FIG. 4D, despite application of a configuring substance such as an etchant over the base protective layer 330 and the protective substance 360, the conductive layer 370 remains and conductively couples via 353 to via 354. In contrast, in some embodiments, the etching process (wet chemical or dry etching in some embodiments) will disconnect the metal lines 370 where the protective substance 360 was not deposited. In some embodiments, the configuring substance comprises one or more reactants from a group of reactants consisting of an etchant, a solvent, an oxidizing agent and a complex-forming agent.

Figure 5A:
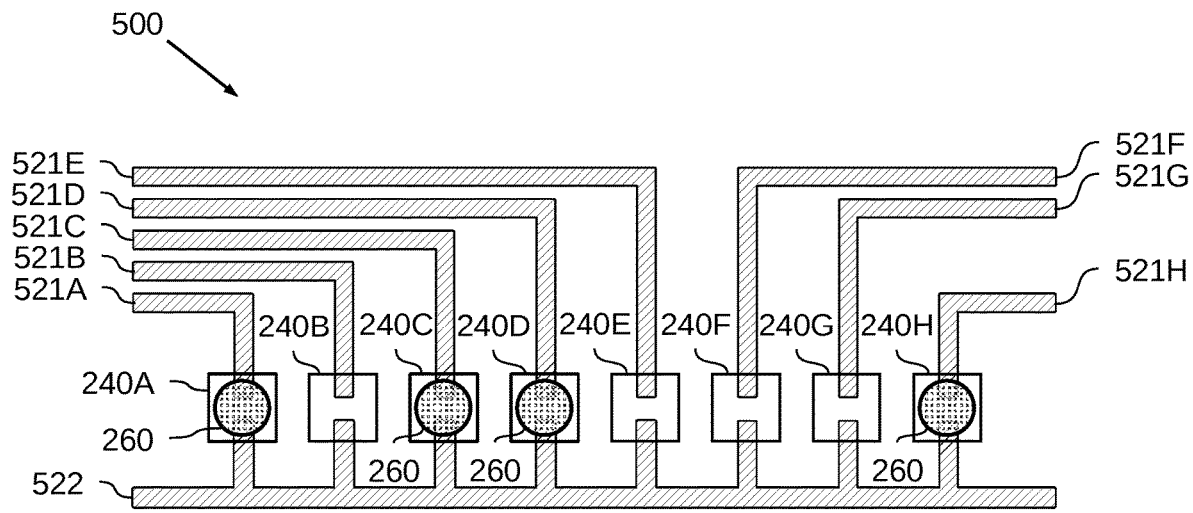
FIGS. 5A-5B illustrate top views of an example of an application of a configurable circuit element structure according to some embodiments.
Figure 5B:
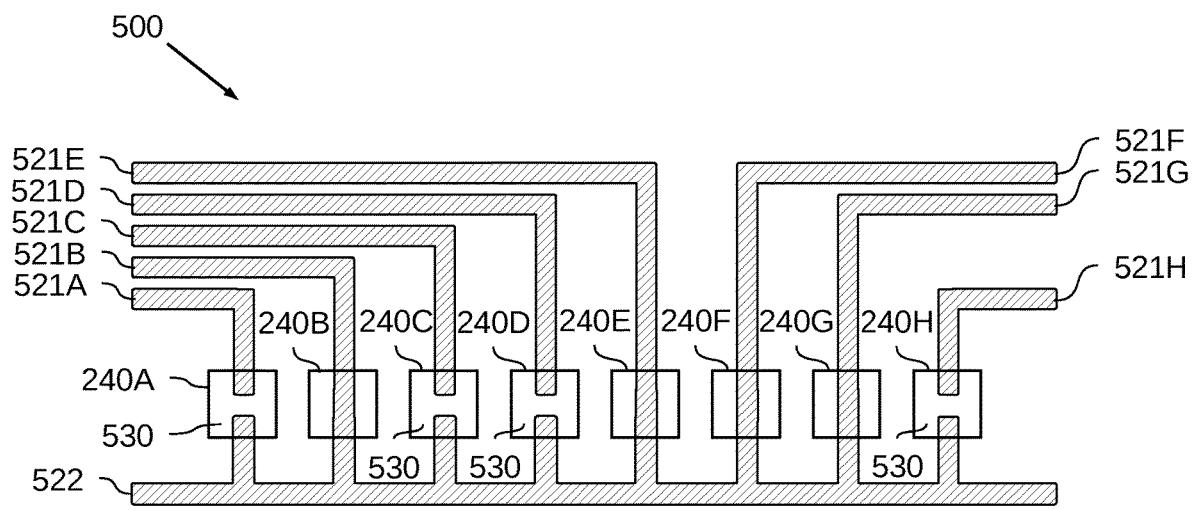

FIGS. 5A-5B illustrate top views of an example of an application at 500 of a configurable circuit element structure according to some embodiments. The application is for electrical coding using configurable circuit element structures. FIG. 5A illustrates configurable circuit element structures are coupled respectively between metal lines 521A-521H and a metal line 522 that is coupled to a common node such as ground. Having first formed a protective base layer (not shown in FIGS. 5A and 5B) on the configurable circuit element structures, wherein the protective base layer includes windows, each window opening 240A-240H exposing one of the configurable circuit element structures to the top, a protective substance 260 is selectively applied to circuit element structures in the window openings 240A, 240C, 240D and 240H.

FIG. 5B illustrates application 500 after a suitable process such as an electroless deposition is used where metal lines 521B, 521E, 521F and 521G are coupled to metal line 522 via circuit element structures exposed in the window openings 240B, 240E, 240F and 240G to the conductive substance 270. Meanwhile, circuit element structures in the window openings 240A, 240C, 240D and 240H that are filled with protective substance 260 have a gap that electrically isolates metal lines 521A, 521C, 521D and 521H from metal line 522.

Figure 6A:
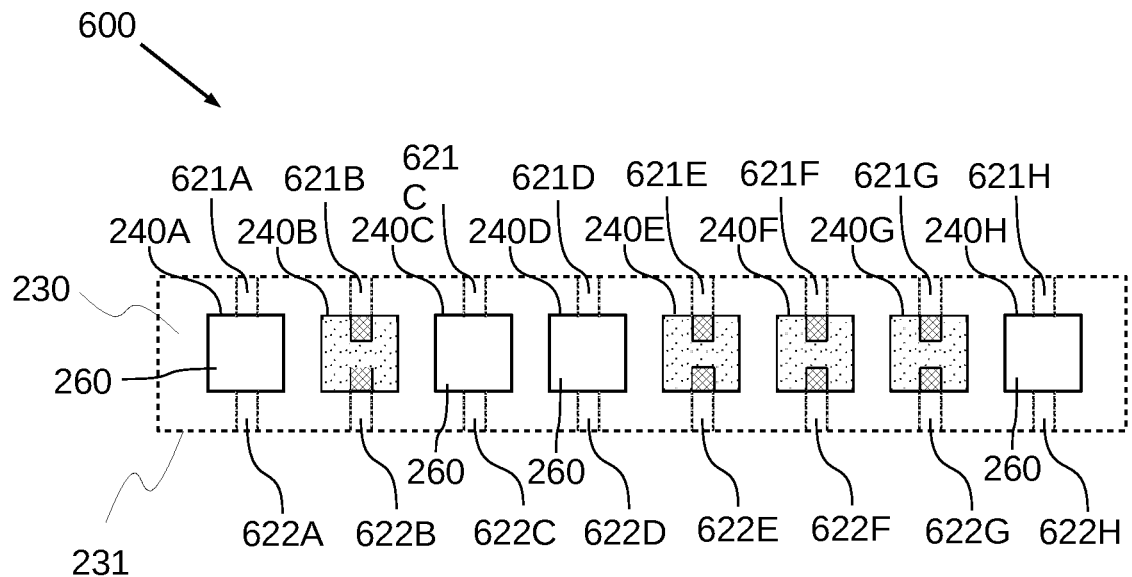
FIGS. 6A-6B illustrate top views of an example of an application of configurable circuit element structures according to some embodiments.
Figure 6B:
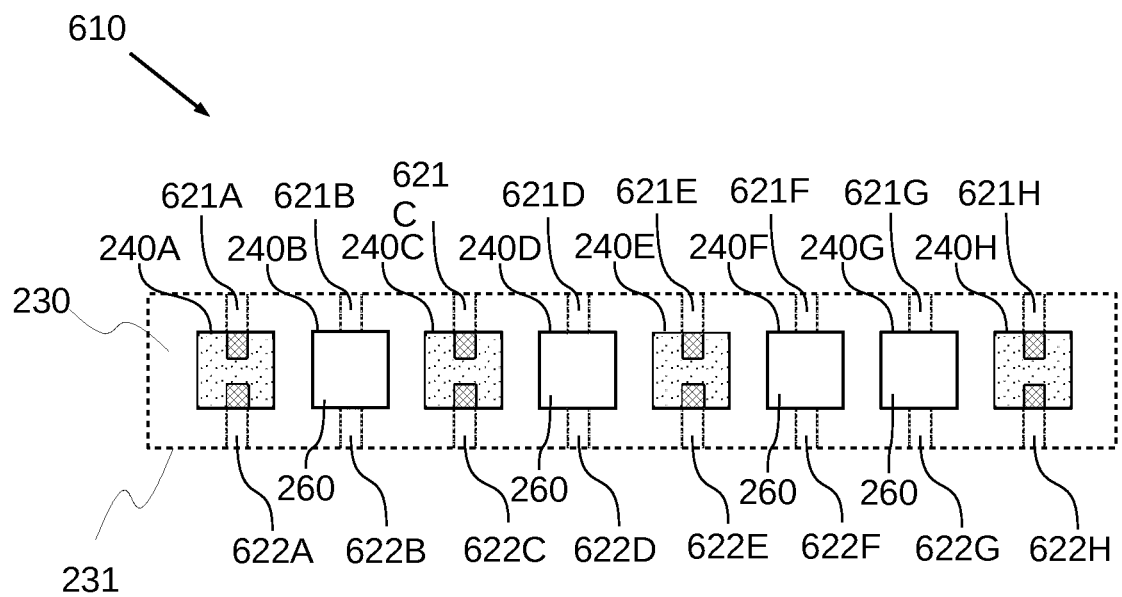

FIGS. 6A-6B illustrate a top view of an example of an application of configurable semiconductor device structures according to some embodiments. FIG. 6A illustrates a configurable circuit element structure at 600 that is mostly covered by a protective layer 230. For configurable circuit element structure 600, each configurable circuit element can be coupled respectively between metal lines 621A-621H and metal lines 622A-622H that, apart from one terminal end, are covered by protective layer 230. For configurable circuit element structure 610, also mostly covered by protective layer 230, likewise, each configurable circuit element can be coupled respectively between metal lines 621A-621H and metal lines 622A-622H. Having first formed the protective base layer 230 on the configurable circuit element structures 600 and 610, wherein the protective base layer includes windows 240A-240H for each corresponding configurable circuit element structure 600 and 610 that exposes the corresponding configurable circuit element structure to the top, a protective substance 260 is selectively applied to the configurable circuit element structures 600 and 610. For configurable circuit element structure 600, a protective substance 260 is provided in the window openings 240A, 240C, 240D and 240H. For configurable circuit element structure 610, a protective substance 260 is provided in the window openings 240B, 240D, 240F and 240G.

In an embodiment, as can be seen in FIGS. 6A-6B, configurable circuit element structures 600 and 610 are manufactured in different portions to become separate die on a same wafer. In this embodiment, configurable circuit element structure 600 includes a protective layer that is different than configurable circuit element structure 610. Configurable circuit element structure 600 includes protective substance 260 in the window openings 240A, 240C, 240D and 240H while configurable circuit element structure 610 includes protective substance 260 in the window openings 240B, 240D, 240F and 240G. In this embodiment, configurable circuit element structures 600 and 610 are the same (e.g., each includes eight configurable circuit elements), but are configured differently as configurable circuit element structure 600 includes protective substance 260 in the window openings 240A, 240C, 240D and 240H while configurable circuit element structure 610 includes protective substance 260 in the window openings 240B, 240D, 240F and 240G.

It is to be understood that the features of the various embodiments described herein may be combined with each other, unless specifically noted otherwise. In particular, while the examples are described above one by one, it should be understood that the method described with reference to FIG. 1 can be varied, complemented and used to implement the exemplary configurable element structures and selectively configured elements in a same semiconductor device. Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein.

In some embodiments, the first semiconductor device structure is associated with a first semiconductor device and the second semiconductor device structure is associated with a second semiconductor device to be separate from the first semiconductor device. In some embodiments, the first semiconductor device structure and the second semiconductor device structure have an identical layout.

Generally, a tool is configured for use in manufacturing semiconductor devices on a wafer. The tool comprises a dispenser configured to selectively dispense a protective substance on the wafer. In some embodiments, the tool is selected from a group consisting of dispensing device, printer, extruder, plasma source. In some embodiments, the protective substance is one of a group consisting of: a photo resist and a passivating substance.

Generally, a computer-readable medium is adapted to be used in manufacturing semiconductor devices on a wafer. The computer-readable medium comprises data that cause a dispenser to selectively dispense a protective substance at a location on the wafer where to selectively dispense the protective substance. In some embodiments, the data represent the location. As used herein, like terms refer to like elements throughout the description.

As used herein, the wording 'etching of a material' to be etched means oxidizing the material to be etched by an acid or some other substance than an acid. For example, etching can be performed by a physical reaction of a solvent with the material to be etched. For another example, etching can be performed by a chemical reaction with the material to be etched caused by a reactant. Further, a complex-forming agent can be used to dissolve the material to be etched.

As used herein, one semiconductor device includes one semiconductor device structure. One semiconductor device structure includes one or more semiconductor device structure elements, herein also referred to as structural elements, circuit elements or features.

As used herein, the word 'exemplary' means serving as an example, instance, or illustration. Any aspect or design described herein as 'exemplary' is not necessarily to be construed as preferred or advantageous over other aspects or designs. Rather, use of the word exemplary is intended to present concepts and techniques in a concrete fashion. The term 'techniques,' for instance, may refer to one or more devices, apparatuses, systems, methods, articles of manufacture, and/or computer-readable instructions as indicated by the context described herein.

As used herein, the articles 'a' and 'an' should generally be construed to mean 'one or more,' unless specified otherwise or clear from context to be directed to a singular form.

As used herein, the term 'or' is intended to mean an inclusive 'or' rather than an exclusive 'or.'

As used herein, the terms 'having', 'containing', 'including', 'with' or variants thereof, and like terms are open ended terms intended to be inclusive. These terms indicate the presence of stated elements or features, but do not preclude additional elements or features.

As used herein, terms such as 'first', 'second', and the like, are also used to describe various elements, regions, sections, etc. and are also not intended to be limiting.

The word 'over', used herein to describe forming a feature, e.g. a layer 'over' a side or surface, may be used to mean that the feature, e.g. the layer, may be formed 'directly on', e.g. in direct contact with, the implied side or surface. The word 'above', used herein to describe forming a feature, e.g. a layer 'above' a side or surface, may be used to mean that the feature, e.g. the layer, may be formed 'indirectly on' the implied side or surface with one or more additional layers being arranged between the implied side or surface and the formed layer.

As used herein, the terms 'a plurality of', 'at least one' and 'one or more' may be understood to include any integer number equal to one or greater than one, i.e. one, two, three, four, etc.

The invention claimed is:

1. A method of manufacturing a plurality of semiconductor devices on a wafer, the method comprising:

forming a structure layer comprising a plurality of semiconductor device structures, wherein the semiconductor device structures include a conductive line that can be changed to an interrupted conductive line, or include the interrupted conductive line that can be changed to the conductive line, wherein the conductive line and the interrupted conductive line each include a first metal line and a second metal line formed on a surface of a substrate of the wafer, the first metal line having a first terminal end and the second metal line having a second terminal end, wherein the first terminal end and the second terminal end are separated by a gap;

forming a base protective layer having a plurality of same openings above the first terminal end of the first metal line and the second terminal end of the second metal line for the conductive line and the interrupted conductive line for the plurality of semiconductor devices, wherein for the conductive line, the first metal line is conductively coupled to the second metal line within the opening, and wherein for the interrupted conductive line, the current flow is impeded by the gap between the first metal line and the second metal line within the opening;

providing a protective substance on the structure layer, wherein the protective substance prevents the change in the conductive line to the interrupted conductive line, or in the interrupted conductive line to the conductive line, wherein the protective substance on a first one of the plurality of semiconductor device structures differs from the protective substance on a second one of the plurality of semiconductor device structures; and applying a configuring substance on the protective substance and the structure layer, wherein, for the first one of the plurality of semiconductor device structures, the configuring substance causes the interrupted conductive line to be changed to the conductive line, or causes the conductive line to be changed to the interrupted conductive line.

2. The method of claim 1, wherein the first one of the plurality of semiconductor device structures is associated with a first one of the plurality of semiconductor devices and the second one of the plurality of semiconductor device structures is associated with a second one of the plurality of semiconductor devices which is separate from the first one of the plurality of semiconductor devices, and wherein the first one of the plurality of semiconductor device structures and the second one of the plurality of semiconductor device structures have a same device geometry.

3. The method of claim 2, wherein the protective substance is a passivating substance.

4. The method of claim 1, wherein providing the protective substance comprises:

selectively depositing the protective substance within the opening of the base protective layer.

5. The method of claim 4, the method further comprising:

generating a data file for use in control of a dispensing device configured to dispense the protective substance.

6. The method of claim 4, the method further comprising:

testing the plurality of semiconductor device structures.

7. The method of claim 6, the method further comprising:

based on a test result, deriving a selected circuit element on the wafer to be configured.

8. A The method of claim 7, wherein the selected circuit element comprises the conductive line.

9. The method of claim 7, wherein the selected circuit element comprises the interrupted conductive line.

10. The method of claim 1, wherein the configuring substance comprises one or more reactants from a group of reactants consisting of an etchant, a solvent, an oxidizing agent and a complex-forming agent.

11. The method of claim 10, wherein the protective substance is configured to resist the one or more reactants.

12. The method of claim 11, wherein the protective layer is a photo resist layer.

13. The method of claim 1, wherein the configuring substance is conductive.

14. The method of claim 1, wherein the configuring substance is configured to become conductive when provided in the opening of the base protective layer.

15. The method of claim 1, wherein the configuring substance comprises a metal.

16. The method of claim 1, wherein the protective layer is a passivation layer.

* * * * *